(12) United States Patent
Doi et al.

(10) Patent No.: US 12,093,066 B2
(45) Date of Patent: Sep. 17, 2024

(54) ELECTRONIC CONTROL DEVICE

(71) Applicant: Hitachi Astemo, Ltd., Hitachinaka (JP)

(72) Inventors: Masahiro Doi, Hitachinaka (JP); Yuri Ohara, Hitachinaka (JP); Takeo Yamashita, Hitachinaka (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 566 days.

(21) Appl. No.: 17/286,698

(22) PCT Filed: Sep. 19, 2019

(86) PCT No.: PCT/JP2019/036682
§ 371 (c)(1),
(2) Date: Apr. 19, 2021

(87) PCT Pub. No.: WO2020/084966
PCT Pub. Date: Apr. 30, 2020

(65) Prior Publication Data
US 2021/0341957 A1 Nov. 4, 2021

(30) Foreign Application Priority Data
Oct. 23, 2018 (JP) ................. 2018-199210

(51) Int. Cl.
*G05F 1/565* (2006.01)
*G05F 1/46* (2006.01)
(Continued)

(52) U.S. Cl.
CPC .............. *G05F 1/565* (2013.01); *G05F 1/465* (2013.01); *G05F 1/577* (2013.01); *H03K 17/223* (2013.01)

(58) Field of Classification Search
CPC ........... G05F 1/565; G05F 1/465; G05F 1/577
See application file for complete search history.

(56) References Cited

U.S. PATENT DOCUMENTS 5,949,279 A * 9/1999 Kwan ................ G06F 1/26
327/543
10,108,212 B2 * 10/2018 Park ................... G05F 1/59
2003/0180997 A1 * 9/2003 Nakayama ....... H03K 17/08128
438/200
(Continued)

FOREIGN PATENT DOCUMENTS

DE    10 2015 120 378 A1    6/2016
JP         11-136049 A       5/1999
(Continued)

OTHER PUBLICATIONS

German-language Office Action issued in German Application No. 11 2019 004 618.7 dated Jun. 22, 2022 with English translation (12 pages).
(Continued)

*Primary Examiner* — Peter M Novak
(74) *Attorney, Agent, or Firm* — Crowell & Moring LLP

(57) ABSTRACT

Provided is a highly versatile and reliable power supply device (power supply ASIC) that can support electronic devices with a wide range of drive currents while suppressing a cost increase, and an electronic control device using the same. An electronic control device includes: a first power supply circuit that outputs a first voltage; a second power supply circuit that generates a second voltage from the first voltage; and a first MOSFET arranged independently of the first power supply circuit and the second power supply circuit. The second power supply circuit includes: a reference power supply that outputs a reference voltage; an amplifier that amplifies the reference voltage; a second MOSFET connected in parallel with the first MOSFET; a voltage detection unit that detects a voltage value of a gate terminal of the first MOSFET; and a switching unit that connects an output from the amplifier to either the gate terminal of the first MOSFET or a gate terminal of the second MOSFET. The switching unit is controlled based on (Continued)

a voltage value at a start detected by the voltage detection unit.

14 Claims, 11 Drawing Sheets

(51) Int. Cl.
    *G05F 1/577*     (2006.01)
    *H03K 17/22*     (2006.01)

(56) References Cited

U.S. PATENT DOCUMENTS

2011/0193538 A1*   8/2011   Arigliano .............. G05F 1/563
                                                       323/282

2012/0161733 A1   6/2012   Hua et al.
2016/0154415 A1   6/2016   Biziitu et al.

FOREIGN PATENT DOCUMENTS

| JP | 11-259152 A | 9/1999 |
| JP | 2005-198439 A | 7/2005 |
| JP | 2007-140650 A | 6/2007 |

OTHER PUBLICATIONS

International Search Report (PCT/ISA/210) issued in PCT Application No. PCT/JP2019/036682 dated Dec. 24, 2019 with English translation (three (3) pages).

Japanese-language Written Opinion (PCT/ISA/237) issued in PCT Application No. PCT/JP2019/036682 dated Dec. 24, 2019 (four (4) pages).

* cited by examiner

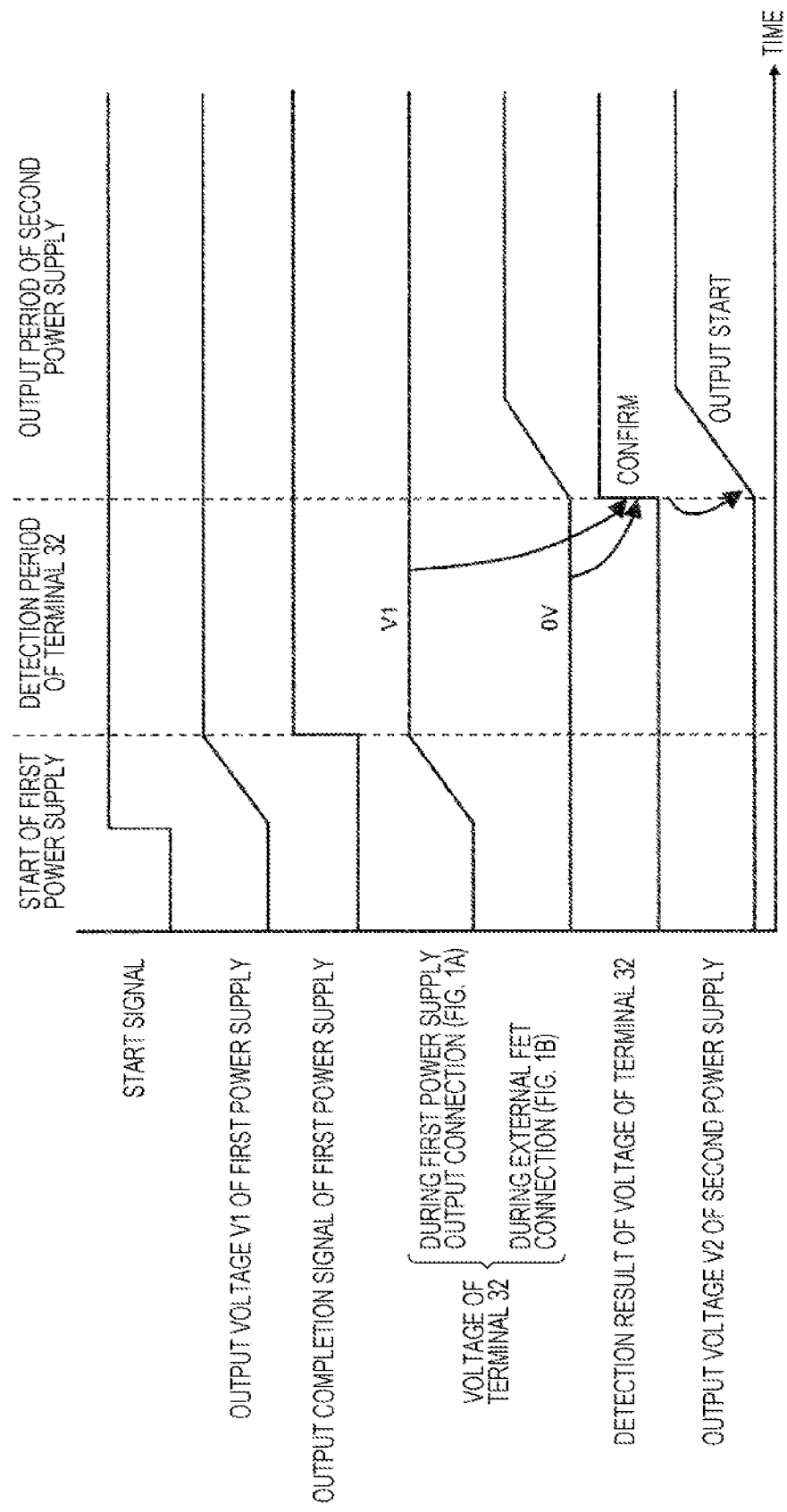

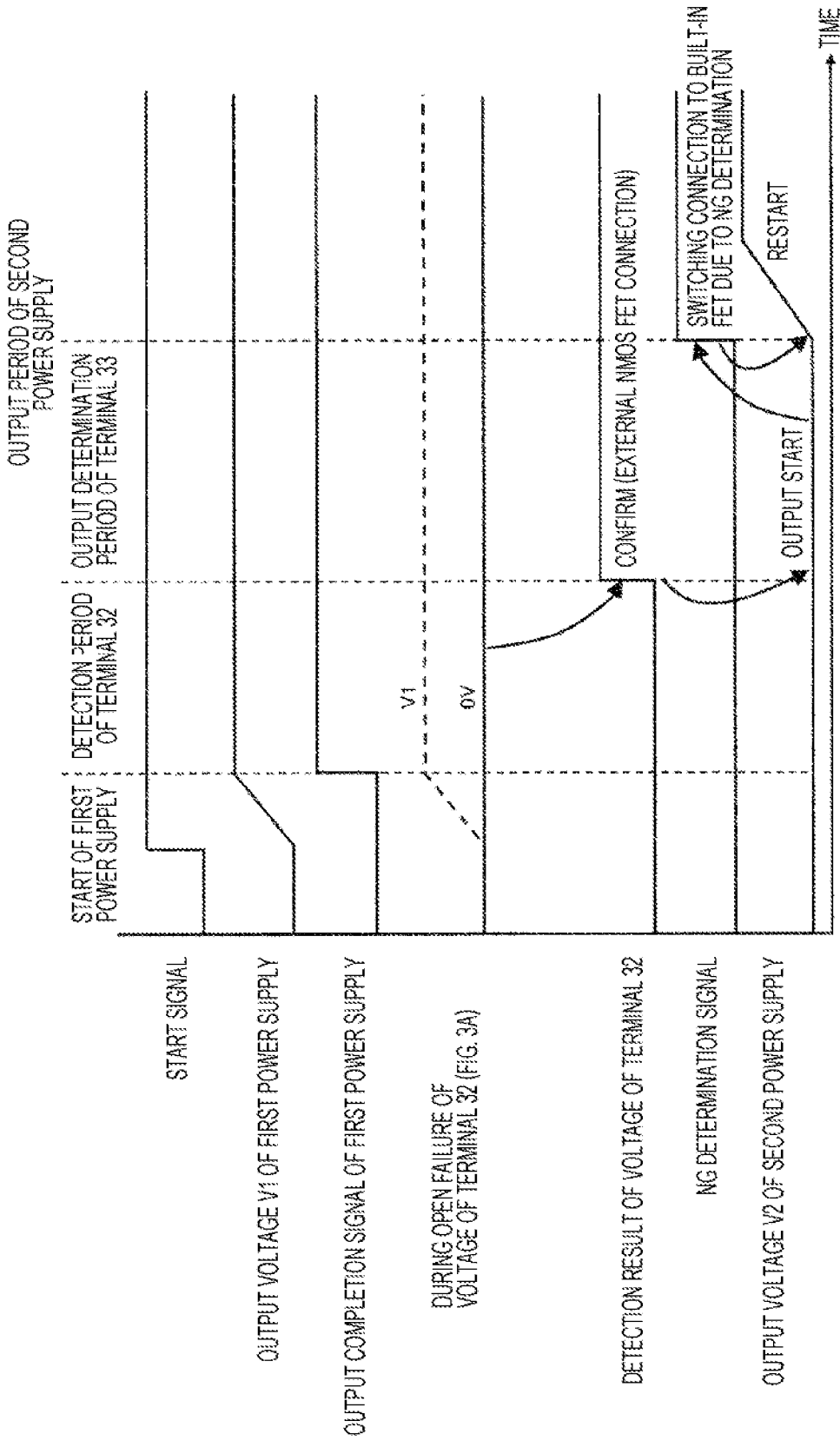

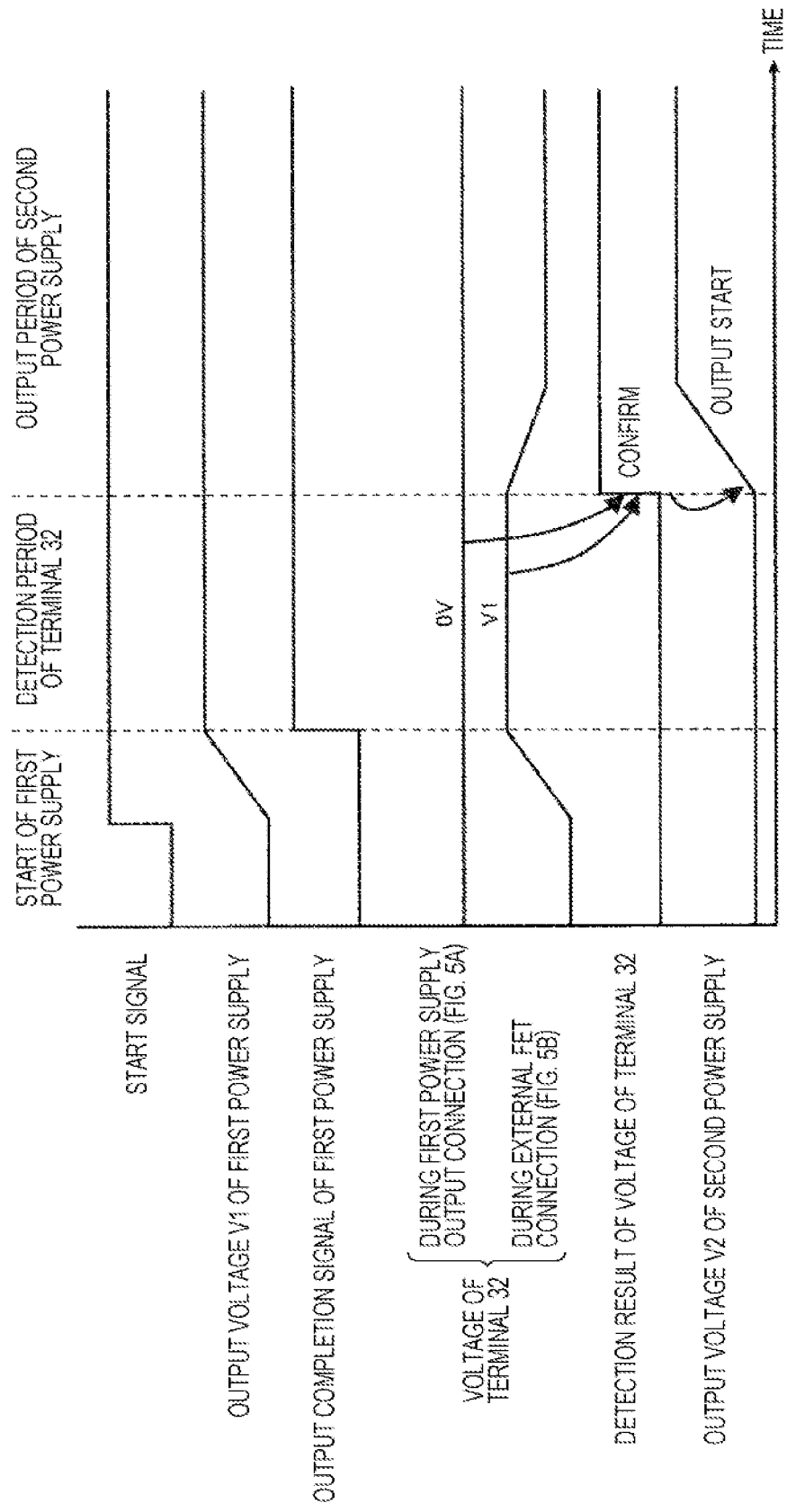

ELECTRONIC CONTROL DEVICE

TECHNICAL FIELD

The present invention relates to a switching circuit (a.k.a. linear regulator) of an output unit of a power supply device in an electronic control device, and particularly to a technology that is effective when applied to an in-vehicle electronic control device that requires control with a wide range of drive currents such as engine control and battery control.

A power supply device mounted on an electronic control device generally has a high current driving capability, and thus, can be used in a wide range of applications. Meanwhile, the use of the power supply device having the high current driving capability in applications with low current driving is unnecessary, leading to an increase in cost of the power supply device (electronic control device).

Here, a semiconductor integrated circuit (IC) has realized high integration and low cost by integrating components in the IC, and a power supply device using the IC. In the case of the power supply device using the IC, the cost increases similarly when the power supply device having a high current driving capability is used in applications for low current driving. Further, if a new IC that is optimal for each application is developed, the production costs increase due to the development cost of the optimal IC.

In this manner, it is required to provide a low-cost and highly versatile power supply device (electronic control device) which enables the use of the power supply device that uses an IC having the same specification for a wide range of applications for current driving.

In in-vehicle electronic control devices as well, the current consumption of semiconductors, such as microcomputers, to be installed has increased with electrification and high functionality of vehicles, and the current driving capability required for the power supply device has increased. On the other hand, it is possible to reduce cost and shorten a product development period by diverting the same power supply device even to an electronic control device with relatively small current consumption.

As a background art in this technical field, for example, there is a technique such as PTL 1.

PTL 1 describes "an IC circuit for a series regulator including: a built-in output control Pch MOSFET; a control unit that compares an output voltage with a predetermined reference voltage and drives the Pch MOSFET according to a result of the comparison; and a first IC terminal that outputs a bias control signal of the Pch MOSFET to the outside of the IC, wherein an external Pch MOSFET is connected to the first IC terminal to enable output control by driving the external Pch MOSFET", and proposes a power supply device that uses the external Pch MOSFET and the built-in Pch MOSFET.

CITATION LIST

Patent Literature

PTL 1: JP 2007-140650 A

SUMMARY OF INVENTION

Technical Problem

As described above, it is required to support a wide range of current driving capabilities while suppressing the cost increase due to over-specification in the power supply device (power supply application specific integrated circuit (ASIC)) mounted on the electronic control device, and particularly in the power supply device (power supply ASIC) of the in-vehicle electronic control device which is expected to be applied to a wide range of electronic devices such as an engine, an inverter, and a battery controller.

Both the external Pch MOSFET and the built-in Pch MOSFET are provided in PTL 1 above, and it is possible to support a wide range of applications from a low current to a high current. However, there is a concern about malfunction (erroneous witching) due to a factor such as noise after a start since the output voltage is compared with the predetermined reference voltage the driving of the external Pch MOSFET and the built-in Pch MOSFET is switched according to the comparison result.

Therefore, an object of the present invention is to provide a highly versatile and reliable power supply device (power supply ASIC) that can support electronic devices with a wide range of drive currents while suppressing a cost increase, and an electronic control device using the same.

Specifically, the object is to realize the power supply device and the electronic control device provided with a reliable switching method for a stable operation of the electronic control device and a power supply circuit that does not cause an increase in IC pins for cost reduction in the power supply device (power supply ASIC) driven while switching between an external FET and an IC built-in FET.

Solution to Problem

In order to solve the above problems, the present invention includes: a first power supply circuit that outputs a first voltage; a second power supply circuit that generates a second voltage from the first voltage; and a first MOSFET arranged independently of the first power supply circuit and the second power supply circuit. The second power supply circuit includes: a reference power supply that outputs a reference voltage; an amplifier that amplifies the reference voltage; a second MOSFET connected in parallel with the first MOSFET; a voltage detection unit that detects a voltage value of a gate terminal of the first MOSFET; and a switching unit that connects an output from the amplifier to either the gate terminal of the first MOSFET or a gate terminal of the second MOSFET. The switching unit is controlled based on a voltage value at a start detected by the voltage detection unit.

Advantageous Effects of Invention

According to the present invention, it is possible to realize the highly versatile and reliable power supply device (power supply ASIC) that can support the electronic devices with a wide range of drive currents while suppressing the cost increase, and the electronic control device using the same.

Specifically, it is possible to prevent an unintended switching operation due to the influence of noise or the like after a start by detecting a stable terminal voltage at the start and latching the result thereof.

Further, a normal operation can be verified by reading the detection result with a microcomputer via a register.

Furthermore, it is possible to provide a power supply device (power supply ASIC) capable of driving a wide range of currents at low cost without requiring an additional terminal for three terminals of an IC required to drive an external FET and a built-in FET, and an electronic control device using the same.

Other objects, configurations, and effects which have not been described above become apparent from embodiments to be described hereinafter.

BRIEF DESCRIPTION OF DRAWINGS

FIG. 2 is a timing chart illustrating an example at the time of starting power supply in the first embodiment.

FIG. 4 is a timing chart illustrating an example at the time of starting power supply in the second embodiment.

FIG. 6 is a timing chart illustrating an example at the time of starting power supply in the third embodiment.

DESCRIPTION OF EMBODIMENTS

Hereinafter, embodiments of the present invention will be described with reference to the drawings. Incidentally, the same configurations in the respective drawings will be denoted by the same reference signs, and detailed descriptions of the overlapping parts will be omitted.

First Embodiment

Figure 1A:
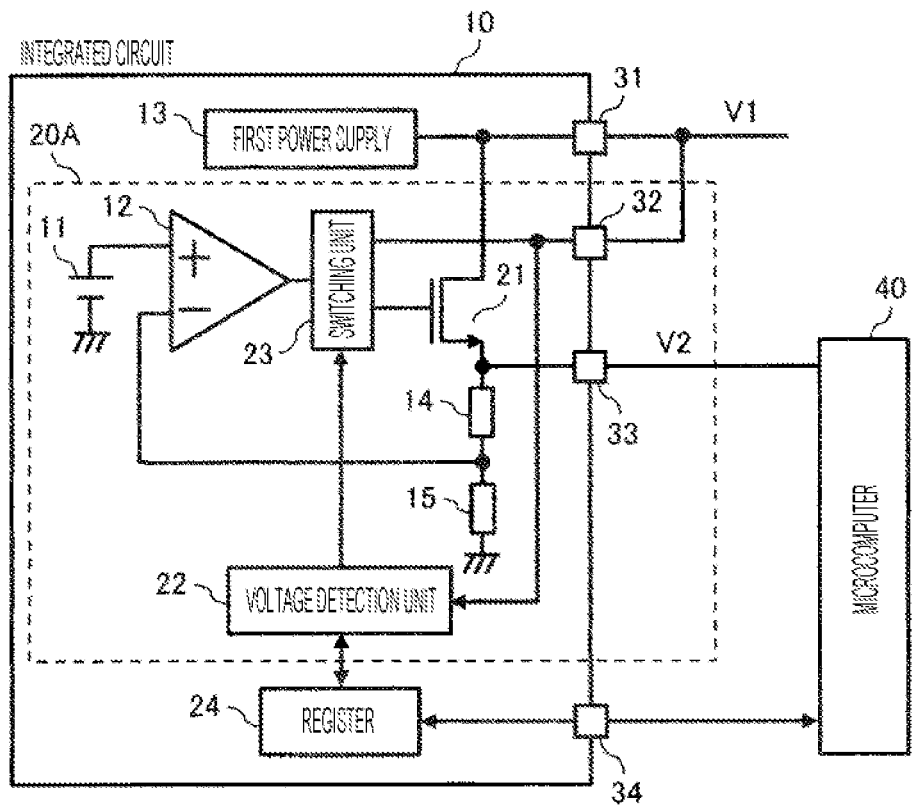
FIG. 1A is a circuit configuration diagram of driving of a built-in FET in a first embodiment.
Figure 1B:
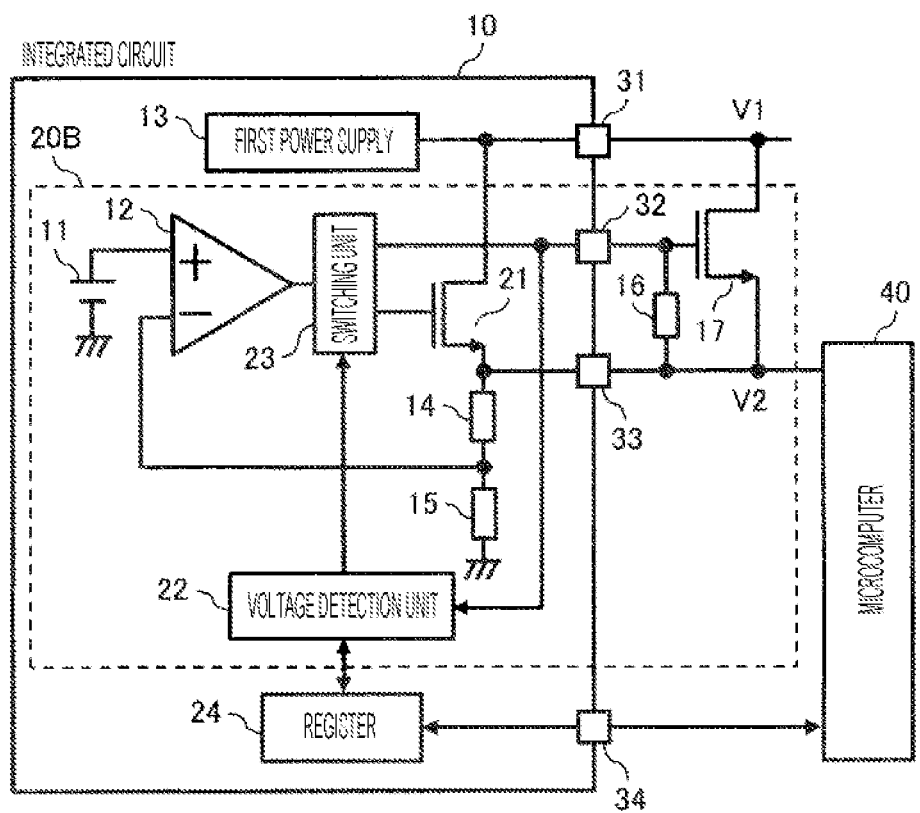
FIG. 1B is a circuit configuration diagram of driving of an external FET in the first embodiment.

A first embodiment of the present invention will be described with reference to FIGS. 1A to 2. FIGS. 1A and 1B illustrate a circuit configuration diagram of a power supply device (power supply ASIC) of the present embodiment, and FIG. 2 is a timing chart illustrating an operation (action) of the present embodiment. FIG. 1A illustrates the power supply device at the time of driving a built-in FET (built-in NMOS FET) 21, and FIG. 1B illustrates the power supply device at the time of driving an external FET (external NMOS FET) 17.

The power supply device illustrated in FIGS. 1A and 1B includes an integrated circuit 10 and includes the external FET (external NMOS FET) 17 in FIG. 1B, and a microcomputer 40 as a load is connected to an output V2 of this power supply device.

The integrated circuit 10 includes a first power supply (circuit) 13 that outputs a voltage V1 via a terminal 31, a voltage detection unit 22 that detects a voltage of a terminal 32, a switching unit 23 that switches an output FET according to a result of the detection, and a register 24 that holds (records) the detection result. The register 24 is connected to the microcomputer 40 via a terminal 34 by serial communication or the like. The terminal 32 is connected to a V1 voltage line (connection line of the terminal 31) in FIG. 1A and connected to a gate of the external NMOS FET 17 in FIG. 1B. The switching unit 23 is connected to a gate terminal of a first MOSFET (the external NMOS FET 17), and is further connected to GND via feedback resistors 14 and 15.

Here, the voltage V1 is an output voltage of the first power supply (circuit) 13, and second power supply circuits 20A and 20B of FIGS. 1A and 1B generate a voltage V2 from this voltage V1. When the power supply device is started, the first power supply circuit first operates to generate the voltage V1.

Next, the second power supply circuits 20A and 20B start operating. At this time, the voltage detection unit 22 detects whether a voltage of the terminal 32 is the voltage V1. When the terminal 32 is connected to V1 as illustrated in FIG. 1A, the terminal 32 has the same voltage as the voltage V1, and the connection to V1 is determined. If the connection to V1 is determined, an output of an amplifier 12 is connected to a gate of the built-in FET 21 by the switching unit 23.

When the detection of the voltage of the terminal 32 and the connection of the FET are completed, the second power supply circuit 20A starts operating, and a reference voltage 11 is amplified by the amplifier 12 to output an output voltage V2 by the built-in FET 21. The output voltage V2 is controlled by negative feedback as a voltage divided by the negative feedback resistors 14 and 15 connected to a terminal 33 is connected (input) to an inverting input of the amplifier 12, and becomes the desired output voltage V2.

On the other hand, when the terminal 32 is connected to the gate of the external NMOS FET 17 in FIG. 1B, the voltage of the terminal 32 is connected to GND via a pull-down resistor 16 and the feedback resistors 14 and 15 and becomes 0 V after starting the first power supply 13. The voltage detection unit detects 0 V of the terminal 32 and determines that the terminal 32 is not connected to V1. An output of the amplifier 12 is connected to the gate of the external NMOS FET 17 by the switching unit 23 based on a detection result. After the connection is completed, the second power supply circuit 20B starts operating, and the desired output voltage V2 is output via the external NMOS FET 17 by a negative feedback operation of an amplifier circuit. The pull-down resistor 16 is arranged between the gate terminal and a source terminal of the first MOSFET (external NMOS FET 17).

As described above, the power supply device (electronic control device) of the present embodiment includes: a first power supply circuit 13 that outputs a first voltage (V1); second power supply circuits 20A and 20B that generate a second voltage (V2) from the first voltage (V1); and a first MOSFET (external NMOS FET 17) arranged independently of the first power supply circuit 13 and the second power supply circuits 20A and 20B. The second power supply circuits 20A and 20B include: a reference power supply 11 that outputs a reference voltage; an amplifier 12 that amplifies the reference voltage; a second MOSFET (built-in NMOS FET 21) connected in parallel with the first MOSFET (external NMOS FET 17); a voltage detection unit 22 that detects a voltage value of a gate terminal of the first MOSFET (external NMOS FET 17); and a switching unit 23 that connects an output from the amplifier 12 to either the gate terminal of the first MOSFET (external NMOS FET 17) or a gate terminal of the second MOSFET (built-in NMOS FET 21). The switching unit 23 is controlled based on a voltage value at a start detected by the voltage detection unit 22. Further, a register 24 that holds (records) the voltage value detected by the voltage detection unit 22 is provided.

Further, in the present embodiment, the first MOSFET is an N-type MOSFET (external NMOS FET 17), and the switching unit 23 connects the output from the amplifier 12 to the gate terminal of the first MOSFET (external NMOS FET 17) when the voltage value at the start detected by the voltage detection unit 22 is 0 V, and connects the output from the amplifier 12 to the gate terminal of the second MOSFET (built-in NMOS FET 21) when the voltage value is the first voltage (V1).

FIG. 2 is a timing chart illustrating the operation (action) of the present embodiment. The first power supply circuit 13 is started from a rise of a start signal, and an output voltage V1 rises. After the rise of the voltage V1 is completed, a detection period of the voltage detection unit 22 starts, and a connection of a voltage of the terminal 32 is determined. The voltage detection unit 22 detects the voltage value of the gate terminal of the first MOSFET (external NMOS FET 17) within a predetermined time after the start of the first power supply circuit 13.

The voltage of the terminal 32 during this detection period becomes the voltage V1 in the case of being connected to the output of the first power supply 13 in FIG. 1A, and becomes 0 V in the case of being connected to the external NMOS FET 17 in FIG. 1B. The voltage detection unit 22 determines whether the voltage of the terminal 32 is the voltage V1 or 0 V during the detection period. The voltage detection unit 22 has a detection filtering time to avoid erroneous detection, and completes the detection on whether the voltage of the terminal 32 is the voltage V1 or 0 V when detecting a constant voltage for a certain time. When the detection of the voltage of the terminal 32 is completed (confirmed), the switching unit 23 is connected with the built-in NMOS FET 21 in the case of FIG. 1A or connected with the external NMOS FET 17 in the case of FIG. 1B according to the detection result, and a desired voltage V2 is output with the start (output start) of the second power supply circuit 20A or 20B.

Since the detection result of the voltage detection unit 22 is latched (held) by the detection unit, the connection of the switching unit 23 does not change after the detection period, and a stable power output can be maintained because there is no erroneous connection due to the influence of noise or the like.

Further, the detection result of the voltage of the terminal 32 is held in the register 24, and the detection result can be transmitted to the microcomputer 40 by serial communication or the like via the terminal 34. As a result, the detection result of the terminal 32 can be referred to from the microcomputer 40, and the voltage detection unit 22 can correctly determine and confirm whether the FET connection is normal.

Furthermore, it is also possible to rewrite a detection result of the register 24 by serial communication from the microcomputer 40 via the terminal 34. When a value of the register 24 is rewritten, the result of the voltage detection unit 22 is also rewritten, and accordingly, the connection of the switching unit 23 can be changed.

That is, the register 24 can be rewritten by communication with the microcomputer 40, and the switching unit 23 can be controlled based on the information held (recorded) in the register 24.

As a result, in the power supply device of FIG. 1B, it is possible to change the connection to the external NMOS FET 17 as the normal connection by rewriting the register 24 after starting the microcomputer even when the built-in NMOS FET 21 is connected and the voltage V2 is output due to the erroneous detection of the voltage of the terminal 32 in the voltage detection unit 22.

As described above, in the power supply device (power supply ASIC) of the present embodiment, it is possible to switching the output FET by detecting whether the terminal 32 of the integrated circuit 10 is connected to the output V1 of the first power supply circuit 13 or the external NMOS FET 17 by a power supply detection unit 22 when the power supply is started, As a result, it is possible to provide the low-cost power supply device (power supply ASIC) capable of supporting a wide range of loads from a low current to a high current and the electronic control device equipped with the same using the integrated circuit 10 having the same specification without requiring an additional pin for switching.

Second Embodiment

Figure 3A:
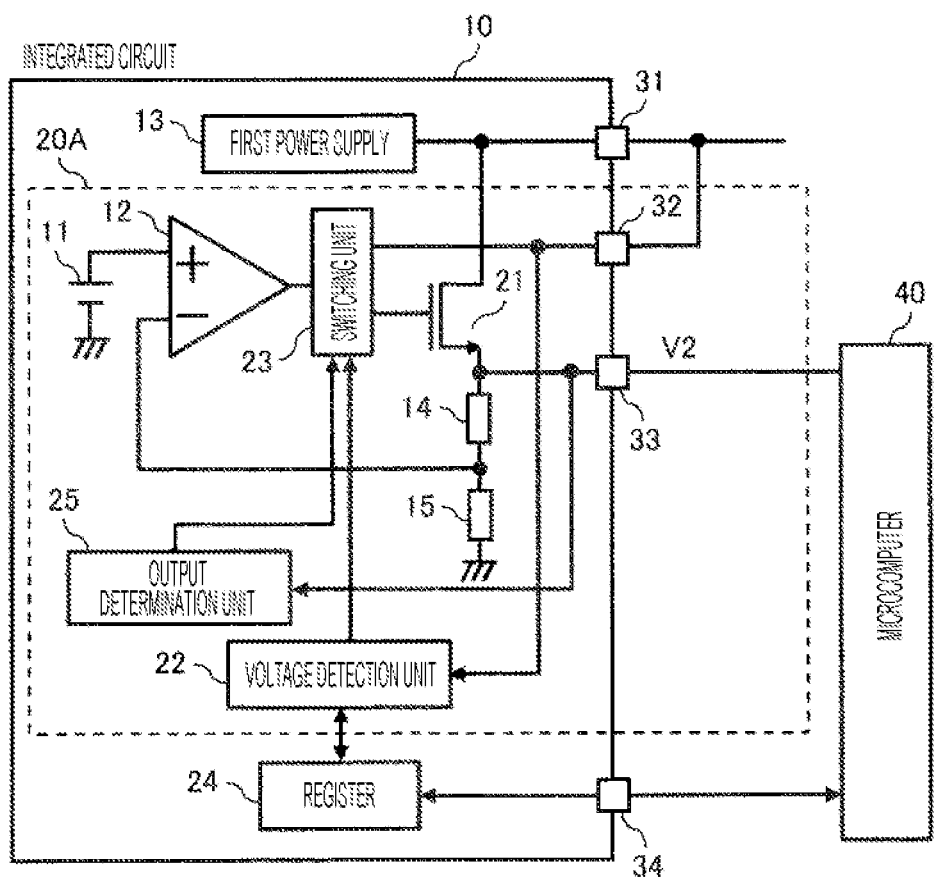
FIG. 3A is a circuit configuration diagram of driving of a built-in FET in a second embodiment.
Figure 3B:
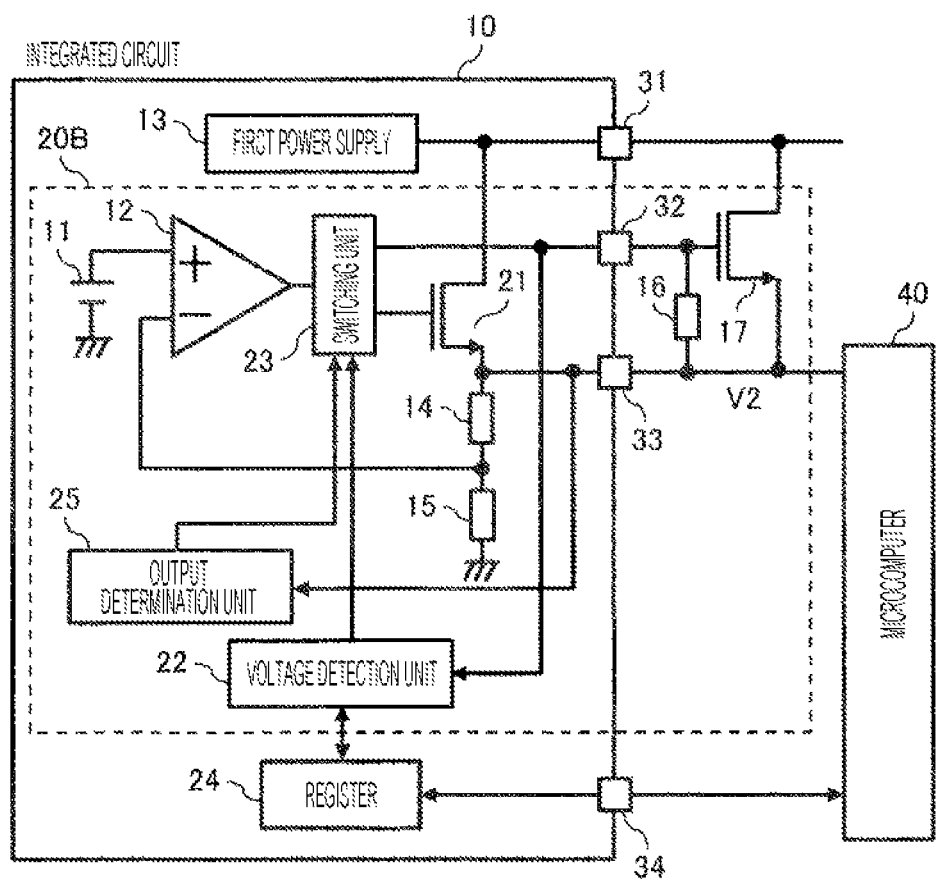
FIG. 3B is a circuit configuration diagram of driving of an external FET in the second embodiment.

Hereinafter, a second embodiment of the present invention will be described with reference to FIGS. 3A to 4. FIGS. 3A and 3B illustrate a circuit configuration diagram of a power supply device (power supply ASIC) of the present embodiment, and FIG. 4 is a timing chart illustrating an operation (action) of the present embodiment.

In FIG. 3A, an output determination unit 25 that determines whether or not the output voltage V2 of the second power supply circuit 20A is normally output is added to the circuit configuration of FIG. 1A.

The output determination unit 25 determines whether the output voltage V2 of the second power supply circuit 20A is normally output at a start. If the output voltage V2 does not reach a desired (predetermined) voltage within a certain time, a connection of the switching unit 23 is reversed.

For example, when an open failure occurs in the terminal 32 in the circuit of FIG. 3A, a voltage of the terminal 32 is sometimes constant at 0 V as illustrated in FIG. 4. In this case, a connection of an external NMOS FET 17 is determined by the detection of the voltage detection unit 22, and the external NMOS FET 17 is selected. However, the voltage V2 is not output since the external NMOS FET 17 is not actually connected. Here, the output determination unit 25 determines (confirms) that the voltage V2 is not output normally, outputs an NG determination signal to reverse the connection of the switching unit 23, and makes a connection with the built-in NMOS FET 21 for a restart. As a result, it is possible to normally generate the voltage V2 even during the open failure of the terminal 32.

Further, even when the voltage detection unit 22 does not perform the desired detection and the switching unit 23 makes an erroneous connection so that V2 is not output normally due to a special factor such as external noise, the voltage V2 is output as the connection of the switching unit 23 is switched to the normal connection by the determination operation of the output determination unit 25.

Similarly, even when an erroneous switching connection is selected due to a failure of some parts or erroneous detection of the voltage detection unit 22 so that the voltage V2 is not output, for example, in FIG. 3B, an opportunity for the voltage V2 to be output normally can be created by reversing the switching unit 23 with the determination operation of the output determination unit 25.

Furthermore, if the voltage V2 is not output normally even after the restart, the connection of the switching unit 23 is further reversed to repeat a restarting operation, so that it is possible to output the voltage V2 normally after a failure state is recovered in a case of a temporary failure such as a short failure on a board.

As described above, in the power supply device (power supply ASIC) of the present embodiment, the output determination unit 25 that determines whether the voltage V2 is normally output at the start is added. Thus, the voltage V2 can be output normally by reversing the switching unit 23 for the restart when the voltage V2 is not started normally due to the failure such as terminal opening and the factor such as external noise.

Third Embodiment

Figure 5A:
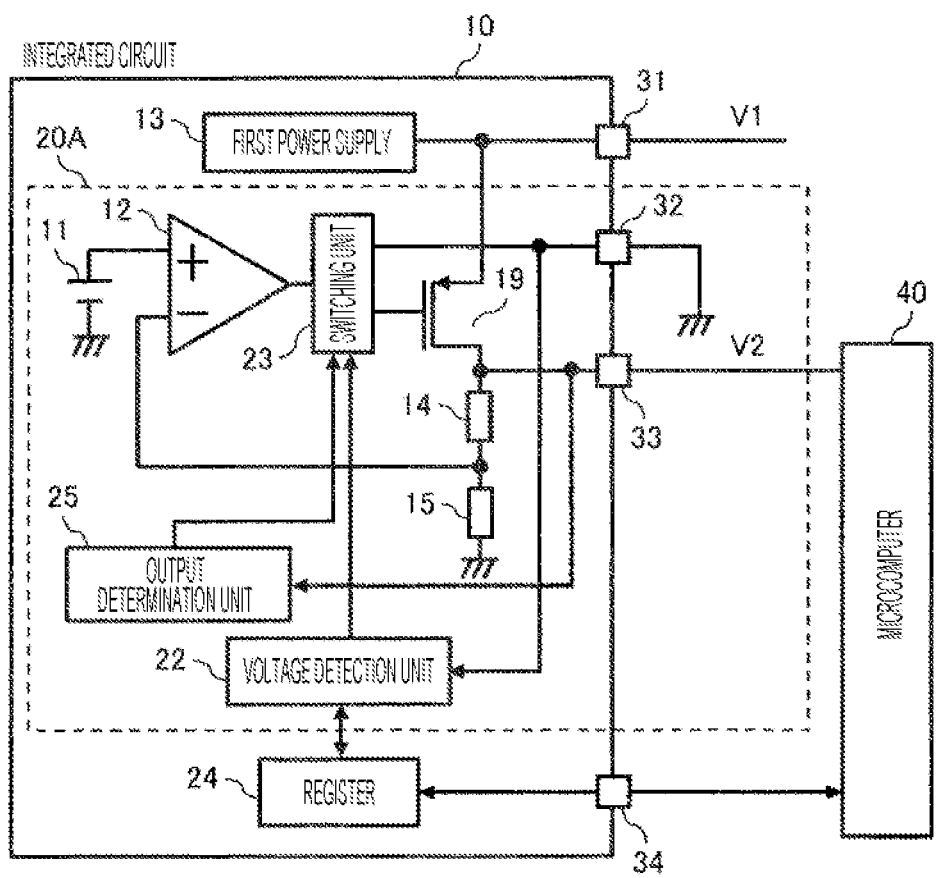
FIG. 5A is a circuit configuration diagram of driving of a built-in FET in a third embodiment.
Figure 5B:
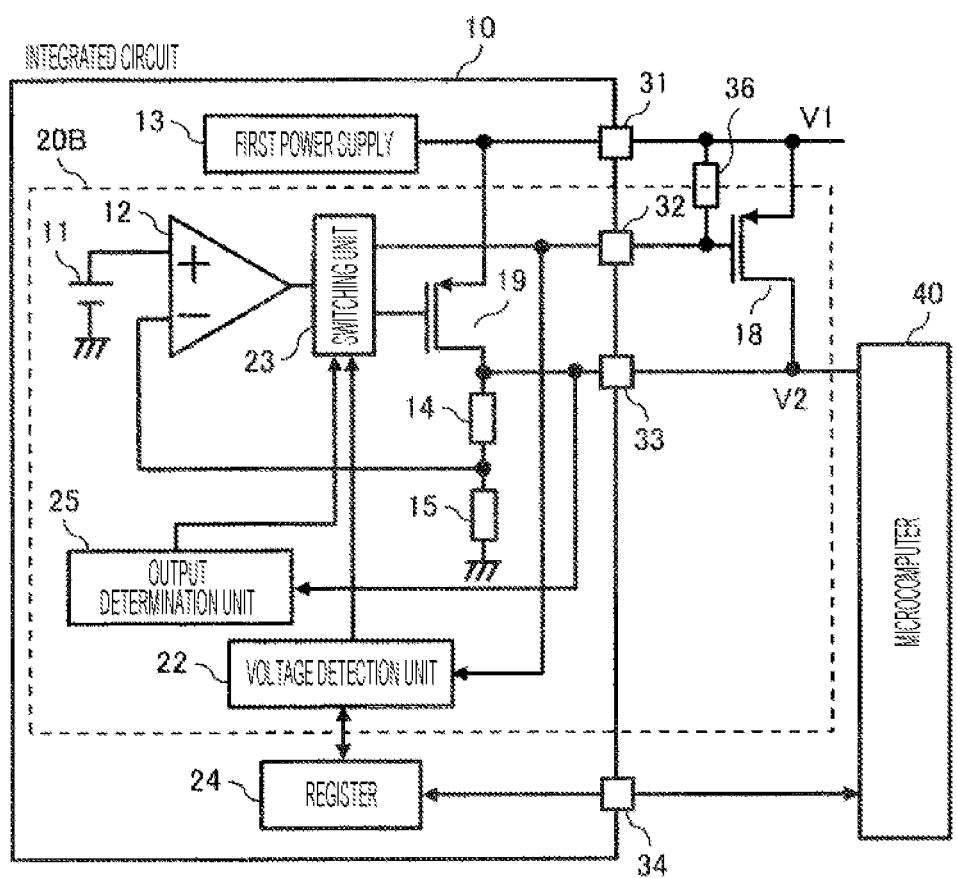
FIG. 5B is a circuit configuration diagram of driving of an external FET in the third embodiment.

Hereinafter, a third embodiment of the present invention will be described with reference to FIGS. 5A to 6. FIGS. 5A and 5B illustrate a circuit configuration diagram of a power supply device (power supply ASIC) of the present embodiment, and FIG. 6 is a timing chart illustrating an operation (action) of the present embodiment. The present embodiment is an example of a case where a PMOS FET is used as an FET.

FIG. 5A is obtained by changing the built-in NMOS FET 21 in FIG. 3A to a built-in PMOS FET 19, and FIG. 5B is obtained by changing the built-in NMOS FET 21 and the external NMOS FET 17 of FIG. 3B to the built-in PMOS FET 19 and an external PMOS FET 18. Further, the pull-down resistor 16 is changed to a pull-up resistor 36. When the external PMOS FET 18 is set as an output as in the present embodiment, a detected voltage of the terminal 32 is different from that in the case of the external NMOS FET 17 in the first and second embodiments. The pull-up resistor 36 is arranged between a gate terminal and a source terminal of the first MOSFET (external PMOS FET 18).

In the case of a connection (circuit configuration) illustrated in FIG. 5B, the terminal 32 is connected to the output V1 of the first power supply circuit 13 via the pull-up resistor 36. Therefore, the voltage of the terminal 32 becomes the voltage V1 as illustrated in FIG. 6 after the start of the output voltage V1 of the first power supply circuit 13. When the terminal 32 has the voltage V1, the voltage detection unit 22 makes a connection with the external PMOS FET 18 by the switching unit 23. After the connection is completed, the second power supply circuit 20B is started, and the desired the voltage V2 is output.

On the other hand, the terminal 32 is connected to GND in FIG. 5A, so that the voltage becomes constant at 0 V, contrary to FIG. 5B. The voltage detection unit 22 detects 0 V of the voltage of the terminal 32 during a detection period, the built-in PMOS FET 19 is connected, and the desired voltage V2 is output.

That is, in the present embodiment, the first MOSFET is a P-type MOSFET (external PMOS FET 18), and the switching unit 23 connects an output from the amplifier 12 to a gate terminal of the first MOSFET (external PMOS FET 18) when a voltage value at a start detected by the voltage detection unit 22 is the first voltage (V1), and connects the output from the amplifier 12 to a gate terminal of the second MOSFET (built-in PMOS FET 19) when the voltage value is 0 V.

In this manner, when PMOS is used for the external FET, the voltage of the terminal 32 is inverted, so that the dedicated integrated circuit 10 is required. Incidentally, regarding the built-in FET, it is not always necessary to distinguish between NMOS and PMOS depending on a configuration of the second power supply circuit including the amplifier 12.

In this manner, even in the case of switching between the external PMOS FET 18 and the built-in FET, the output FET can be switched by detecting the voltage of the terminal 32 similarly to the first embodiments and the second embodiment. As a result, it is possible to provide the low-cost power supply device (power supply ASIC) capable of supporting a wide range of loads from a low current to a high current and the electronic control device equipped with the same using the integrated circuit 10 having the same specification without requiring an additional pin for switching.

Fourth Embodiment

Figure 7:
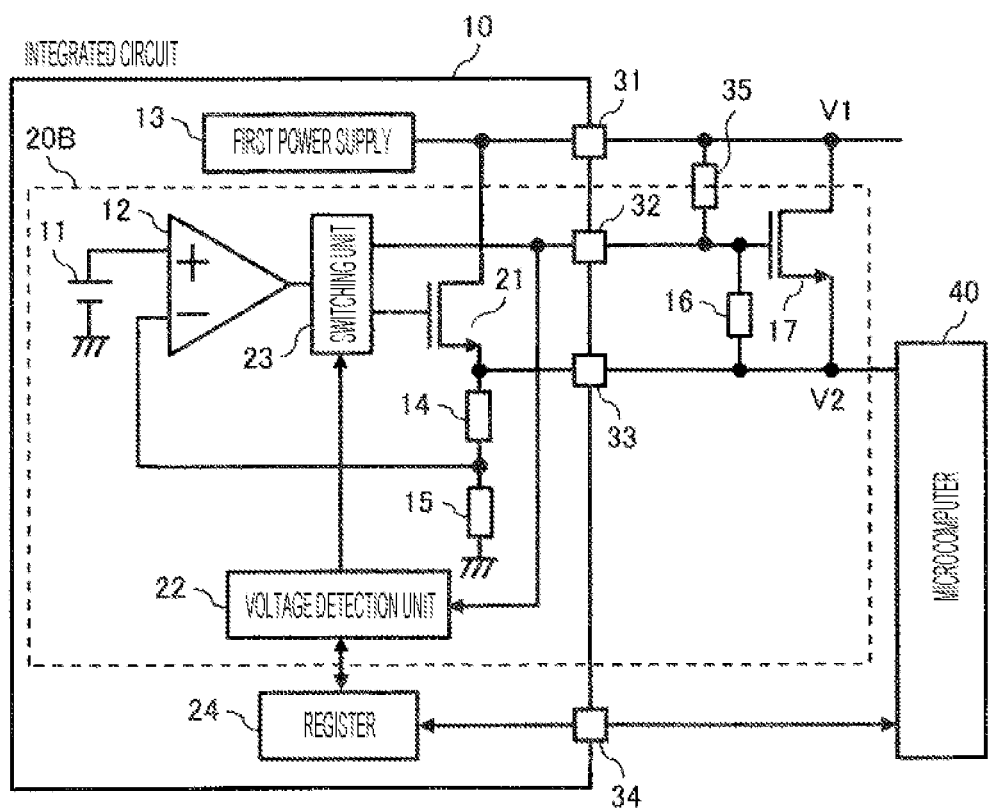
FIG. 7 is a circuit configuration diagram in a fourth embodiment.

Hereinafter, a fourth embodiment of the present invention will be described with reference to FIG. 7. FIG. 7 realizes the circuits of FIGS. 1A and 1B illustrated in the first embodiment by selecting the mounting/non-mounting (wiring connection/non-connection) of the components arranged on the board using the same circuit board. This is a circuit configuration example.

A configuration equivalent to the circuit configuration in FIG. 1A is realized by non-mounting (non-connection) of the external NMOS FET 17 and the pull-down resistor 16 and mounting (wiring connection) of a 0Ω resistor 35 in FIG. 7. Further, a configuration equivalent to the circuit configuration illustrated in FIG. 1B can be realized conversely by non-mounting (non-connection) of the 0Ω resistor 35 and mounting (wiring connection) of the external NMOS FET 17 and the pull-down resistor 16.

That is, in a power supply device (electronic control device) of the present embodiment, the first power supply circuit 13, the second power supply circuit 20B, and the first MOSFET (external NMOS FET 17) are arranged on the same circuit board, the 0Ω resistor 35 is arranged between gate terminals of the first power supply circuit 13 and the first MOSFET (external NMOS FET 17), and a circuit configuration of the second power supply circuit 20B is determined by selecting the wiring connection of each element of the first MOSFET (external NMOS FET 17), the pull-down resistor 16, and the 0Ω resistor 35.

In this manner, a connection of the terminal 32 can be changed by changing the mounting and non-mounting (wiring connection and non-connection) of a small number of parts in the circuit configuration (circuit board configuration) illustrated in FIG. 7, and it is possible to realize the second power supply circuit driven by an external FET and a built-in FET using the same board. As a result, the same board pattern (circuit board) can be used for a plurality of applications, and the low-cost power supply device can be realized.

Fifth Embodiment

Figure 8:
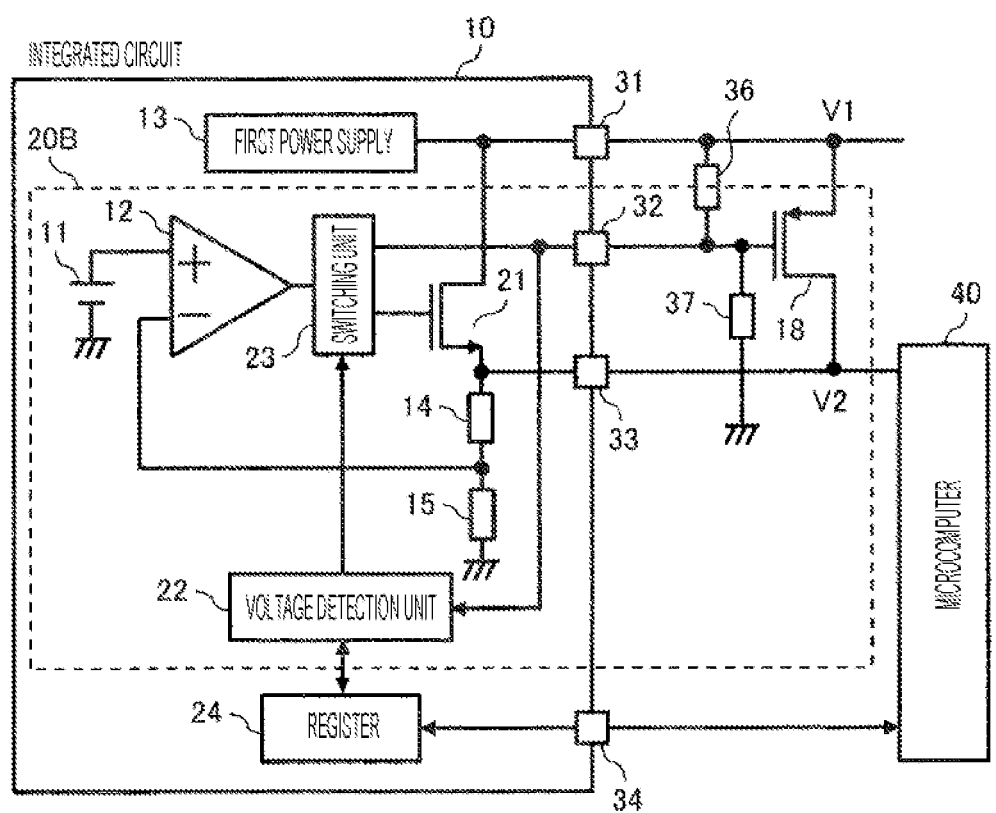
FIG. 8 is a circuit configuration diagram in a fifth embodiment.

Hereinafter, a fifth embodiment of the present invention will be described with reference to FIG. 8. The present embodiment is an example in which a PMOS is used as an external FET, and corresponds to a modification of the fourth embodiment (FIG. 7).

The same circuit board can be used to switch between the external PMOS FET 18 drive and the built-in NMOS FET 21 by selecting mounting and non-mounting (wiring connection and non-connection) of the external PMOS FET 18, the pull-up resistor 36, and the 0Ω resistor 37 similarly to the fourth embodiment (FIG. 7).

In the case of driving of the external FET, the external PMOS FET 18 and the pull-up resistor 36 are mounted (connected by wiring), and the 0Ω resistor 37 is not mounted (not connected). In the case of driving of the built-in FET, conversely, the external PMOS FET 18 and the pull-up resistor 36 are not mounted (not connected), and the 0Ω resistor 37 is mounted (connected by wiring).

That is, in a power supply device (electronic control device) of the present embodiment, the first power supply circuit 13, the second power supply circuit 20B, and the first MOSFET (external NMOS FET 18) are arranged on the same circuit board, the pull-up resistor 36 is arranged between gate terminals of the first power supply circuit 13 and the first MOSFET (external PMOS FET 18), the gate terminal of the first MOSFET (external PMOS FET 18) is connected to GND via the 0Ω resistor 37, and a circuit configuration of the second power supply circuit 20B is determined by selecting the wiring connection of each element of the first MOSFET (external PMOS FET 18), the pull-up resistor 36, and the 0Ω resistor 37.

As a result, it is possible to realize the second power supply circuit driven by the external FET and the built-in FET using the same board pattern (circuit board) similarly to the fourth embodiment, and the low-cost power supply device can be realized.

Incidentally, the present invention is not limited to the above-described embodiments, but includes various modifications.

For example, the above-described embodiments have been described in detail in order to describe the present invention in an easily understandable manner, and are not necessarily limited to one including the entire configuration that has been described above. Further, some configurations of a certain embodiment can be substituted by configurations of another embodiment, and further, a configuration of another embodiment can be also added to a configuration of a certain embodiment. Further, addition, deletion, or substitution of other configurations can be made with respect to some configurations of each of the embodiments.

REFERENCE SIGNS LIST

10 integrated circuit
11 reference voltage (reference power supply)
12 amplifier
13 first power supply (circuit)
14, 15 feedback resistor (negative feedback resistor)
16 pull-down resistor
17 external FET (external NMOS FET)
18 external FET (external PMOS FET)
19 built-in FET (built-in PMOS FET)
20A, 20B second power supply circuit
21 built-in FET (built-in NMOS FET)
22 voltage detection unit
23 switching unit
24 register
25 output determination unit
31, 32, 33, 34 terminal
35, 37 0Ω resistor
36 pull-up resistor
40 microcomputer

The invention claimed is:

1. An electronic control device comprising:
   a first power supply circuit that outputs a first voltage;
   a second power supply circuit that generates a second voltage from the first voltage; and
   a terminal connected to either a gate terminal of a first MOSFET that outputs the second voltage, the output of the first power supply circuit, or the ground;
   wherein the second power supply circuit includes:
   a reference power supply that outputs a reference voltage;
   an amplifier that amplifies the reference voltage;
   a second MOSFET that receives the output of the amplifier and outputs the second voltage;
   a voltage detection unit that detects a voltage value of the terminal; and
   a switching unit that connects an output from the amplifier to either one of the terminal or a gate terminal of the second MOSFET, and
   the switching unit is controlled based on a voltage value at a start detected by the voltage detection unit, wherein
   the voltage detection unit has a detection filtering time and completes the detection when the voltage of the terminal maintains a constant voltage for a certain time, and
   the detection result of the voltage detection unit is latched by the voltage detection unit.

2. The electronic control device according to claim 1, wherein
   the first MOSFET is an N-type MOSFET, and
   the switching unit connects the output from the amplifier to the terminal when the voltage value at the start detected by the voltage detection unit is 0 V, and connects the output from the amplifier to the gate terminal of the second MOSFET when the voltage value at the start detected by the voltage detection unit is the first voltage.

3. The electronic control device according to claim 1, wherein
   the first MOSFET is a P-type MOSFET, and
   the switching unit connects the output from the amplifier to the terminal when the voltage value at the start detected by the voltage detection unit is the first voltage, and connects the output from the amplifier to the gate terminal of the second MOSFET when the voltage value at the start detected by the voltage detection unit is 0 V.

4. The electronic control device according to claim 1, wherein
   the voltage detection unit detects a voltage value of the terminal within a predetermined time after start of the first power supply circuit.

5. The electronic control device according to claim 1, wherein
   the first MOSFET is a P-type MOSFET, and
   a pull-up resistor is arranged between the gate terminal and a drain terminal of the first MOSFET.

6. The electronic control device according to claim 1, wherein
   the switching unit is connected to the gate terminal of the first MOSFET, and further connected to GND via a resistor.

7. The electronic control device according to claim 1, further comprising
   a register that records a voltage value detected by the voltage detection unit.

8. The electronic control device according to claim 7, further comprising
   a microcomputer to which the second voltage is input, wherein the register and the microcomputer are connected by serial communication.

9. The electronic control device according to claim 8, wherein
   the register is rewritable by communication with the microcomputer, and
   the switching unit is controlled based on information recorded in the register.

10. The electronic control device according to claim 1, further comprising
    an output determination unit that determines the second voltage, wherein the output determination unit reverses a connection of the switching unit when the second voltage does not reach a predetermined voltage within a certain time.

11. The electronic control device according to claim 10, wherein
when the second voltage does not reach the predetermined voltage, the output determination unit repeatedly reverses the connection of the switching unit until the second voltage reaches the predetermined voltage.

12. The electronic control device according to claim 1, wherein
the first MOSFET is an N-type MOSFET, and
a pull-down resistor is arranged between the gate terminal and a source terminal of the first MOSFET.

13. The electronic control device according to claim 12, wherein
the first power supply circuit, the second power supply circuit, and the first MOSFET are arranged on an identical circuit board,
a 0Ω resistor is arranged between the first power supply circuit and the gate terminal of the first MOSFET, and
a circuit configuration of the second power supply circuit is determined by selecting a wiring connection of each element of the first MOSFET, the pull-down resistor, and the 0Ω resistor.

14. The electronic control device according to claim 5, wherein
the first power supply circuit, the second power supply circuit, and the first MOSFET are arranged on an identical circuit board,
a pull-up resistor is arranged between the first power supply circuit and the gate terminal of the first MOSFET, and the gate terminal of the first MOSFET is connected to GND via a 0Ω resistor, and
a circuit configuration of the second power supply circuit is determined by selecting a wiring connection of each element of the first MOSFET, the pull-up resistor, and the 0Ω resistor.

* * * * *